United States Patent
Jenei et al.

(10) Patent No.: US 12,150,388 B2
(45) Date of Patent: Nov. 19, 2024

(54) ELECTROPLATING FOR VERTICAL INTERCONNECTIONS

(71) Applicant: IQM Finland Oy, Espoo (FI)

(72) Inventors: Máté Jenei, Espoo (FI); Kok Wai Chan, Espoo (FI); Hasnain Ahmad, Espoo (FI); Manjunath Ramachandrappa Venkatesh, Espoo (FI); Wei Liu, Espoo (FI); Lily Yang, Espoo (FI); Tianyi Li, Espoo (FI); Jean-Luc Orgiazzi, Espoo (FI); Caspar Ockeloen-Korppi, Espoo (FI); Alessandro Landra, Espoo (FI); Mario Palma, Espoo (FI)

(73) Assignee: IQM Finland Oy, Espoo (FI)

( * ) Notice: Subject to any disclaimer, the term of this patent is extended or adjusted under 35 U.S.C. 154(b) by 50 days.

(21) Appl. No.: 17/734,504

(22) Filed: May 2, 2022

(65) Prior Publication Data

US 2022/0359808 A1    Nov. 10, 2022

(30) Foreign Application Priority Data

May 4, 2021 (FI) .................................. 20215519

(51) Int. Cl.
*H10N 60/01* (2023.01)
*H10N 60/81* (2023.01)

(52) U.S. Cl.
CPC .......... *H10N 60/01* (2023.02); *H10N 60/815* (2023.02)

(58) Field of Classification Search
None
See application file for complete search history.

(56) References Cited

U.S. PATENT DOCUMENTS

| | | |
|---|---|---|
| 5,171,711 A | 12/1992 | Tobimatsu |
| 7,112,522 B1 * | 9/2006 | Tsao .................. H01L 24/05 257/E23.021 |
| 9,070,606 B2 | 6/2015 | Yoshida et al. |
| 2005/0164483 A1 * | 7/2005 | Jeong .................. H01L 24/11 257/E23.021 |
| 2007/0218676 A1 * | 9/2007 | Wang .................. H01L 21/4853 438/614 |
| 2009/0091028 A1 * | 4/2009 | Lin .................. H01L 24/05 257/737 |
| 2011/0278716 A1 * | 11/2011 | Hsu .................. H01L 24/11 257/737 |
| 2012/0241949 A1 * | 9/2012 | Sasaki .................. H01L 24/03 228/256 |

(Continued)

OTHER PUBLICATIONS

Search Report issued to Application No. FI 20215519 dated Dec. 1, 2021, 2 pages.

(Continued)

*Primary Examiner* — Scott B Geyer
(74) *Attorney, Agent, or Firm* — Meunier Carlin & Curfman LLC

(57) ABSTRACT

The invention relates to a method for forming flip chip bumps using electroplating. The method allows the formation of flip chip bumps in a way that is compatible with already-formed sensitive electronic components, such as Josephson junctions, which may be used in quantum processing units. The invention also relates to a product and a flip chip package in which flip chip bumps are formed with the disclosed method.

14 Claims, 4 Drawing Sheets

(56) References Cited

U.S. PATENT DOCUMENTS

| | | | | | |
|---|---|---|---|---|---|
| 2012/0256313 | A1* | 10/2012 | Guerin | ............... | H01L 24/03 257/738 |
| 2013/0075907 | A1* | 3/2013 | Pang | ............... | H01L 24/03 257/E21.507 |
| 2013/0082091 | A1* | 4/2013 | Matejat | ............... | H01L 24/11 228/176 |
| 2013/0241071 | A1* | 9/2013 | Hsieh | ............... | H01L 24/11 257/E23.068 |
| 2014/0151874 | A1* | 6/2014 | Obu | ............... | H01L 23/13 257/737 |
| 2015/0221605 | A1* | 8/2015 | Atanasova | ............... | C23F 1/26 257/737 |
| 2015/0287654 | A1* | 10/2015 | Uehling | ............... | H01L 24/14 438/15 |
| 2016/0155715 | A1* | 6/2016 | Lin | ............... | H01L 24/81 257/737 |
| 2016/0190080 | A1* | 6/2016 | Chen | ............... | H01L 24/11 257/773 |
| 2017/0278814 | A1* | 9/2017 | Hung | ............... | H01L 24/16 |
| 2018/0076165 | A1* | 3/2018 | Aoki | ............... | H01L 24/30 |
| 2018/0151342 | A1* | 5/2018 | Fan | ............... | H01L 21/02013 |
| 2019/0164923 | A1* | 5/2019 | Ishii | ............... | H01L 24/17 |
| 2019/0326245 | A1* | 10/2019 | Baello | ............... | H01L 24/09 |
| 2020/0013740 | A1* | 1/2020 | Bae | ............... | H01L 24/08 |
| 2020/0273837 | A1* | 8/2020 | Onozeki | ............... | H01L 24/16 |
| 2020/0303339 | A1* | 9/2020 | Arvin | ............... | H01L 23/53228 |
| 2021/0125950 | A1* | 4/2021 | Hisada | ............... | H01L 24/13 |

OTHER PUBLICATIONS

Office Action issued to Application No. FI 20215510 dated Dec. 1, 2021, 7 pages.

Rosenberg et al., "3D integrated superconducting qubits"; npj|Quantum Information; online journal: www.nature.com/npjqi; Published Oct. 9, 2017, 5 pgs.

Foxen et al., "Qubit compatible superconducting interconnects"; IOP Publishing; Quantum Science and Technology; Published Nov. 30, 2017; 12 pgs.

Rosenberg et al., "Solid-State Qubits"; IEE Microwave Magazine; Aug. 2020; 14 pgs.

Qiuping et al., "Electroplated indium bump arrays and the bonding reliability"; Journal of Semiconductors vol. 31, No. 11, Nov. 2010; 7 pgs.

Merken et al., "Technology for Very Dense Hybrid Detector Arrays Using Electroplated Indium Solderbumps"; IEE Transactions on Advanced Packaging vol. 26, No. 1; Feb. 2003; 5 pgs.

Search Report issued to related EP Application No. 2217sa0838.1, dated Jun. 22, 2023, 9 pages.

Qiuping et al., "Electroplated indium bump arrays and the bonding reliability" Journal of Semiconductors, vol. 31, No. 11, May 14, 2010.

D Dochev et al., "The influence of aging and annealing on the properties of Nb/Al—AlOx/Nb tunnel junctions," 9th European Conference on Applied Superconductivity (EUCAS 09), Journal of Physics: Conference Series 234 (2010), doi:10.1088/1742-6596/234/4/042006.

\* cited by examiner

ELECTROPLATING FOR VERTICAL INTERCONNECTIONS

PRIORITY CLAIM

This application claims priority to Finnish Patent Application No. 20215519, filed on May 4, 2021, the entire disclosure of which is incorporated by reference herein.

TECHNICAL FIELD

The invention relates to the fabrication of high component density integrated circuit devices.

BACKGROUND

In three-dimensional integrated circuit devices, integrated circuit components occupy not just a single substrate side, but are distributed on both sides of a substrate and/or on the sides of multiple unified dice, e.g., in a stack. The distribution of circuit components on different layers or design faces provides more flexibility for qubit chip design. The distribution of circuit components on different layers or design faces also enables higher component density.

SUMMARY

According to a first aspect of the invention, a method is provided that includes:
- forming a first resist over a patterned wafer, the first resist defining one or more first openings through which one or more areas of the patterned wafer are exposed;
- depositing an under bump metallization layer on the first resist and one or more exposed areas of the patterned wafer;
- forming a second resist over the deposited under bump metallization layer, the second resist defining one or more second openings, each of the second openings exposing an area of the under bump metallization layer within one of the one or more first openings;
- depositing a flip chip bump within each of the one or more openings in the second resist by electroplating; and
- removing the first resist, the second resist and areas of the under bump metallization layer that lie between the first resist and second resist.

The patterned wafer may include one or more quantum processing unit components. Prior to forming the first resist over the patterned wafer, the method may further comprise forming the patterned wafer by forming the one or more quantum processing unit components on the wafer. The one or more quantum processing unit components may include one or more Josephson junctions and/or other tunnelling barrier components. The one or more quantum processing unit components may form one or more qubits. The one or more qubits may be planar qubits.

The under bump metallization layer may be deposited by physical vapor deposition of the under bump metallization material.

Physical vapor deposition of the under bump metallization material may be performed by electron beam evaporation and may be performed at an angle offset from perpendicular to the surface of the first resist such that a portion of the sidewall or sidewalls of the first openings remain uncovered by the under bump metallization layer.

Alternatively, physical vapor deposition of the under bump metallization material may be performed at an angle perpendicular to the surface of the first resist such that the under bump metallization material deposited on the sidewalls of the first openings permits solvent to penetrate to the first resist.

In a further alternative, the under bump metallization layer may be deposited by chemical vapor deposition of the under bump metallization material such that the under bump metallization material deposited on the sidewalls of the first openings permits solvent to penetrate to the first resist.

In all of the above alternatives, deposition of the under bump metallization layer may be performed such that the portions of the under bump metallization layer that are in direct contact with the exposed areas of the patterned wafer are electrically continuous with the portion of the under bump metallization layer that is deposited on the first resist.

Depositing the flip chip bumps by electroplating may include using the under bump metallization layer as a cathode such that flip chip bump material is deposited on sections of the under bump metallization layer that are exposed by the second openings in the second resist.

Depositing the flip chip bumps by electroplating may include depositing the flip chump bump material with a height of at least 15 micrometers (μm).

The flip chip bumps may be indium flip chip bumps.

The exposed areas of the patterned wafer may be exposed electrical contacts.

The method may further comprise forming a flip chip package by connecting the patterned wafer to external circuitry via the flip chip bumps. The distance between the pattered wafer and the external circuitry is at least 15 μm.

According to a second aspect of the invention, a product is provided. The product comprises:
- a patterned wafer;
- one or more areas of under bump metallization on the patterned wafer; and
- one or more flip chip bumps, wherein each flip chip bump is formed on one of the one or more areas of under bump metallization,
- wherein the one or more flip chip bumps have a height of at least 15 μm.

The product may be formed using the method described above.

The one or more flip chip bumps may be indium flip chip bumps.

The patterned wafer may include one or more quantum processing unit components. The one or more quantum processing unit components may include one or more Josephson junctions and/or other tunnelling barrier components. The one or more quantum processing unit components may form one or more qubits. The one or more qubits may be planar qubits.

The one or more areas of under bump metallization may be electrically isolated from other areas of under bump metallization.

According a third aspect of the invention, a flip chip package is provided. The flip chip package comprises the product described above and external circuitry. The patterned wafer is connected to the external circuitry via the flip chip bumps. Additionally, the patterned wafer is separated from the external circuitry by a space of at least 15 μm.

DETAILED DESCRIPTION

The present disclosure provides a method for manufacturing integrated circuit devices with flip chip bumps. The method is particularly suited to the formation of flip chip bumps on integrated circuit devices that include components which are sensitive to heat and chemicals used in conventional fabrication processes. Such heat and chemical sensitive devices include, for example, superconducting integrated circuit devices, which may include Josephson junction-based qubits or other tunnelling barrier components. Exposure to the heat and/or chemicals of a conventional fabrication process can negatively affect the properties of the device, for example, resulting is a reduction in coherence time of a qubit.

The qubit or qubits formed in the integrated circuit device may be planar qubits, in which the non-linear LC circuit that is used to store and manipulate quantum information is coupled to a photonic mode that is defined by a coplanar waveguide-based structure that can be defined in a two-dimensional plane. This stands in contrast to a cavity qubit, in which the LC circuit is coupled to a photonic mode defined by a three-dimensional cavity. Such planar qubits can be distributed on different faces of substrates/wafers with airbridges or flip-chip bonds and the component may be connected by through-silicon vias. This may be referred to as a 2.5D structure The method of the present disclosure is shown in detail in FIGS. 1A to 1F and FIG. 2. FIGS. 1A to 1F show cross-sectional views of an integrated circuit device at various steps of the disclosed method. FIG. 2 is a flow chart showing the disclosed method.

Figure 1A:
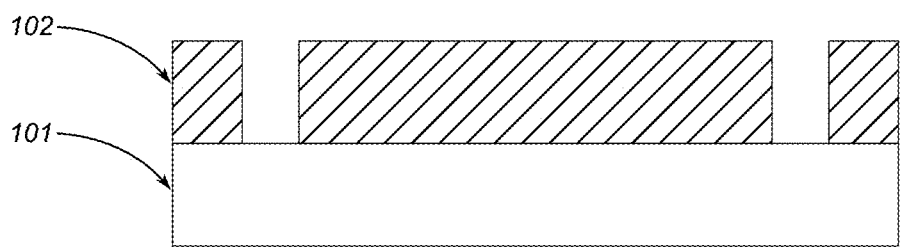
FIGS. 1A to 1F show intermediate results of steps of an example fabrication process, according to an embodiment of the present disclosure.
Figure 2:
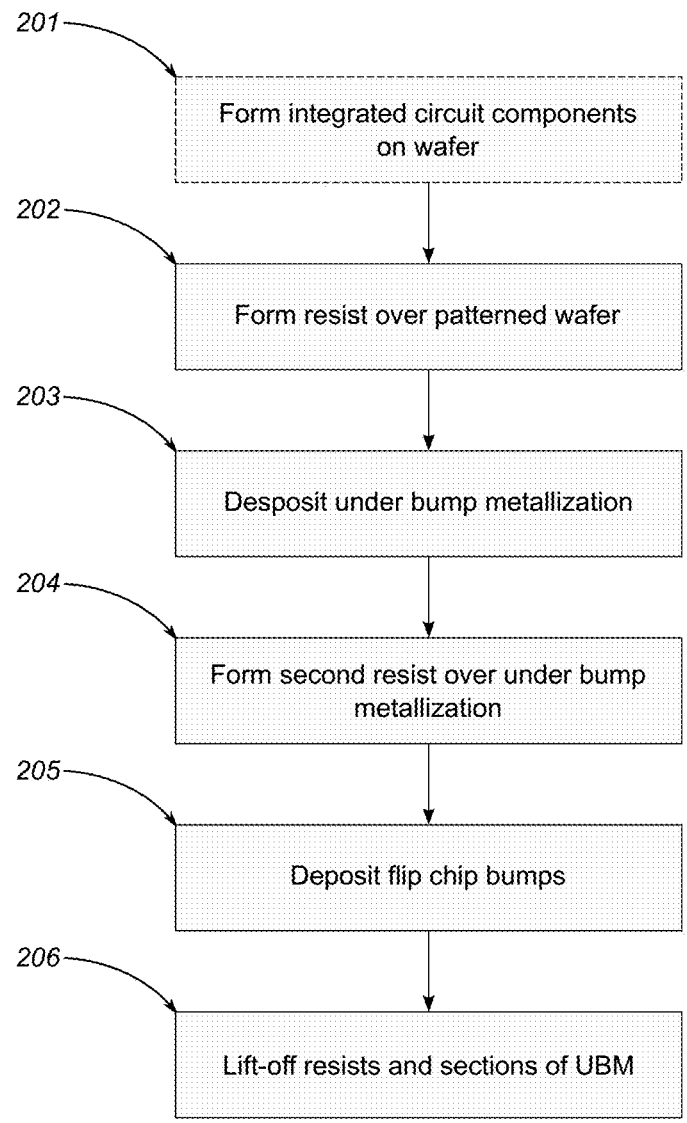
FIG. 2 is a flow chart depicting the example fabrication process, according to an embodiment of the present disclosure.

FIG. 1A shows a patterned wafer that includes a wafer substrate 101, e.g., silicon, and a superconducting film 102. The superconducting film 102 is electrically connected to one or more components of an integrated circuit device, such as Josephson junctions. Additionally, the superconducting film 102 forms a base metal layer upon which those components are fabricated before the process of the present disclosure occurs. FIG. 1A corresponds to a result of optional step 201 of the method shown in FIG. 2A. At step 201, integrated circuit components, such as components of a quantum processing unit, are formed on the wafer substrate 101. The quantum processing unit components may include one or more qubits, which themselves include a tunnelling barrier component such as a Josephson junction, a coupler, a manipulator, and/or a readout structure. Step 201 may be performed before the method of the present invention is started at step 202.

Figure 1B:
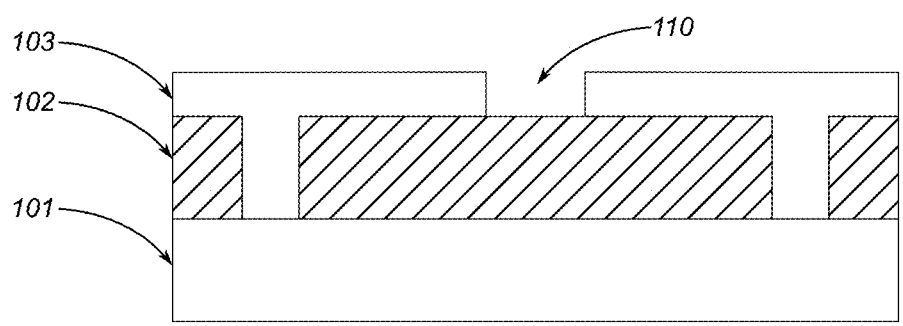

At step 202 of FIG. 2, a resist is formed over the patterned wafer. The resist (also referred to as a first resist) defines one or more openings (also referred to as first openings) through which one or more areas—either electrical contact or electrically isolated regions—of the patterned wafer are exposed. FIG. 1B shows the patterned wafer following step 202, with the resist 103 present on top of the superconducting film 102. The resist 103 may be, for example, a photo-resist, and may be formed by any suitable method known in the art. The resist is patterned, for example, using lithography to form one or more openings 110 in the resist. Each opening 110 in the resist exposes an area of the superconducting film 102. The size and locations of the openings 110 are limited such that the openings do not divide the resist 103 into distinct, disconnected sections. The opening 110 defines the location in which a flip chip bump is formed. The opening 110 may therefore expose an electrical contact of one or more of the components formed in the superconducting film 102, or may be located above an electrically isolated location on the superconducting film 102 such that the flip chip bump provides structural support in the overall assembled integrated circuit package.

Figure 1C:
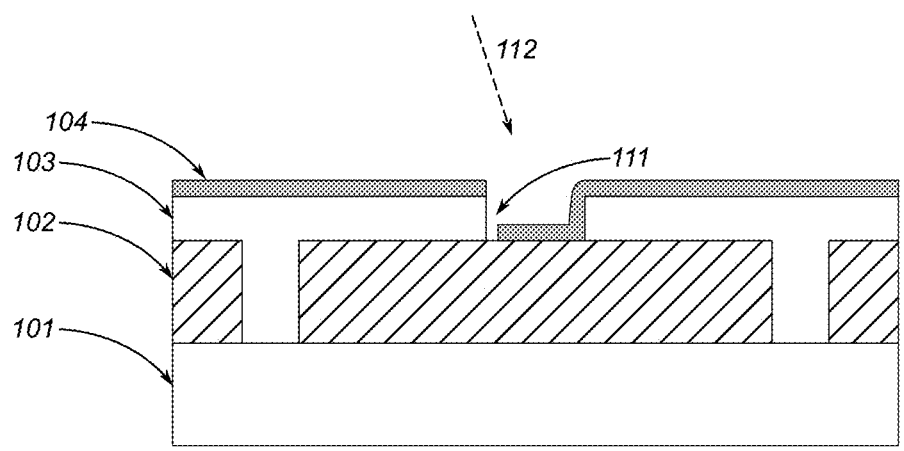

FIG. 1C shows the result of step 203 in which an under bump metallization (UBM) layer 104 is deposited on top of the resist 103 and the exposed areas of the patterned wafer, i.e., the superconducting film 102. The UBM 104 may be formed by physical vapor deposition (PVD) of the under bump metallization material. In one embodiment depicted in FIG. 1C, physical vapor deposition of the UBM may be performed by electron beam evaporation at an angle offset from perpendicular to the surface of the resist 103 such that a portion of the sidewall 111 of the opening 110 remains uncovered by the under bump metallization layer 104. In FIG. 1C, an exemplary angle of 20.5 degrees from perpendicular to the plane of the wafer is shown by arrow 112 to illustrate the angle of UBM material deposition, leading to the sidewall 111 of the resist 103 that is not in line of sight to the PVD target remaining essentially free of the UBM material. While it is not shown in cross-section of FIG. 1C, it should be appreciated that the UBM 104 on the left side of the drawing is electrically continuous with the UBM material present in the opening 110 and on the right side of the drawing, as the opening 110 does not divide the resist 103 into distinct sections, the regions of the UBM 104 on the left side and right side of the drawing are connected by other regions of UBM 104 out of the plane of the drawing.

In an alternative embodiment, the UBM 104 may be deposited by physical vapor deposition, such as e-beam evaporation or sputtering, without an offset angle, i.e., at a direct angle, perpendicular to the plane of the wafer, or by chemical vapor deposition. The resulting UBM 104 is evenly deposited over the surface of the resist 103 and on the area of the superconducting film 102 that is exposed by the opening 110, but the sidewalls of the opening 110 receive relatively little coating of the UBM material as they are aligned essentially parallel to the incoming material. As a result, the sidewalls of the opening 110 are sufficiently coated with UBM material to ensure that the UBM 104 at the bottom of the opening 110 (in contact with the superconducting film 102) is electrically continuous with the UBM 104 that is located on top of the resist 103, but is sufficiently porous or otherwise weak within the opening 110 to allow solvent or any other suitable chemical for removing the resist 103 to penetrate the UBM material on the sidewalls of the opening 110 and reach the resist 103 below the UBM 104.

Figure 1D:
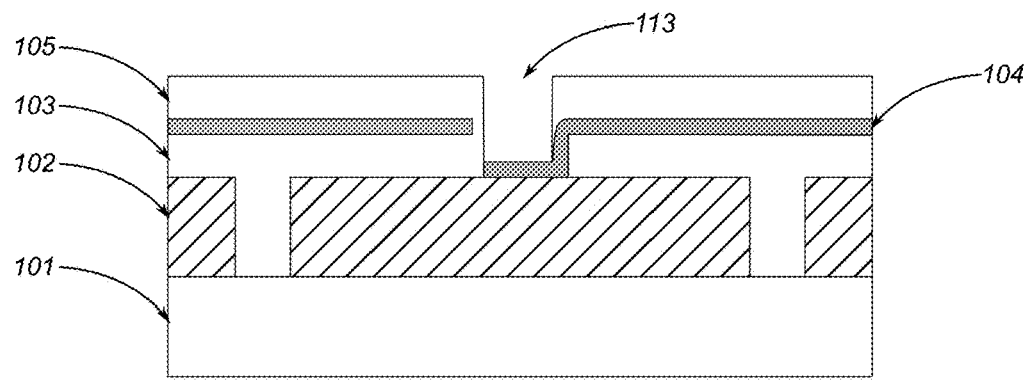

FIG. 1D shows a subsequent stage of the process following deposition and patterning (e.g., by lithography) of a second resist layer 105 above the UBM 104 at step 204 of the method shown in FIG. 2. A second opening 113 is formed in the second resist 105 to expose a section of the UBM 104. The area or section of UBM 104 that is exposed by the second opening 113 lies within the first opening 110. In other words, the second opening 113 exposes at least the section of the UBM 104 that is in direct contact with the superconducting film 102. The second opening 113 may be smaller than the first opening 110.

Figure 1E:
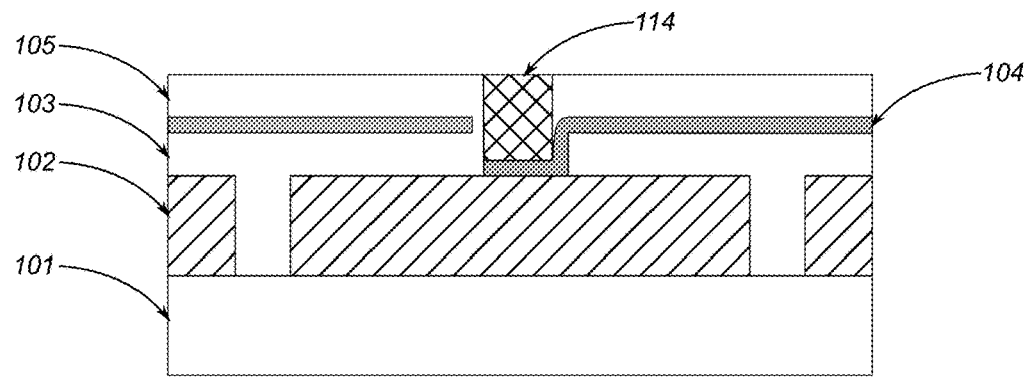

FIG. 1E shows a further stage of the process following deposition of a flip chip bump 114 by electroplating at step 205 of the method shown in FIG. 2. In the electroplating step 205, the UBM 104 acts as the cathode of an electrolytic cell upon which the flip chip bump material is deposited as electrical current flows through the electrolytic cell. The electrolytic cell may be completed by an electrolytic solution containing ions of the flip chip bump material and by an anode, which may be made up of the flip chip bump material or an inert conductive material. Preferably, the flip chip bump material is indium. It should be appreciated, however, that the method described here can be used with other flip chip bump materials. Since only the areas of the UBM 104 that are exposed by the second opening 113 are exposed to the electrolytic solution, these are the only areas on which the flip chip bump material 114 is deposited. The electroplating process can be driven by direct current, in which case the current and time duration of the electroplating process are controlled in order to control the amount of flip chip bump material 114 that is deposited on the exposed areas of the UBM 104. Alternatively, pulse electroplating can be used, in which case the pulse amplitude and width are controlled in order to control the amount of flip chip bump material 114 that is deposited on the examiner areas of the UBM 104.

The formation of flip chip bumps 114 with the electroplating process described above enable the height of the flip chip bumps to extend beyond the maximum height of flip chip bumps formed by prior art techniques, which is typically in the range of 10-15 µm. The flip chip bumps formed by the electroplating process may have a height above the wafer or under bump metallization 104 greater than 15 µm, or greater than 20 µm. This enables chip-to-chip separation in the final flip chip package to be greater than 15 µm, or greater than 20 µm. A larger chip-to-chip separation in the final flip chip packages has the advantage of reduced capacitive coupling between chip faces, thereby reducing crosstalk between the chips. If the crosstalk between the chips is smaller, then it is possible to further increase component density on the chips (e.g., readout structures can overlap). Furthermore, with a chip-to-chip separation above 15 µm, cavity modes do not have any significant effect on the properties of a qubit formed on one or both of the chips.

Figure 1F:
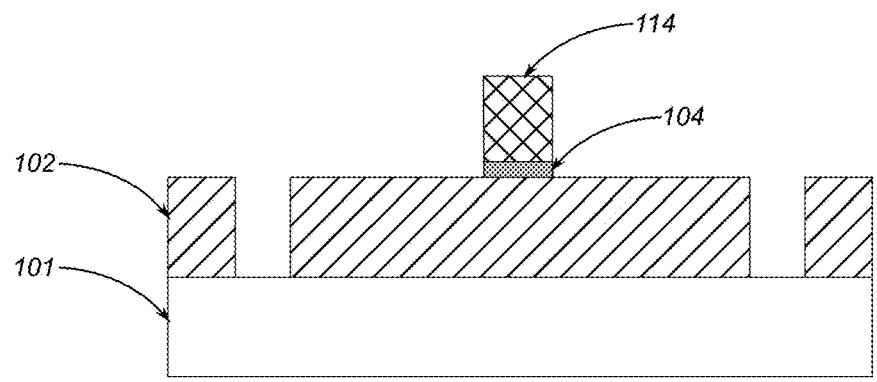

FIG. 1F shows the result after a final step 206 of the method shown in FIG. 2, in which the resist layers 103 and 105 and areas of the UBM 104 that are not located between the flip chip bump 114 and the superconducting film 102 are removed. The result of the process is that one or more flip chip bumps 114 forms on isolated islands of UBM 104. This is possible due to the retention of the first resist layer 103, upon which the UBM is deposited and the final removal of both resist layers 103 and 105 along with the unnecessary sections of the UBM 104. The removal—or lift-off—of the resist layers 103 and 105 and unnecessary sections of the UBM 104 may be performed by solvent, as mentioned above, which is able to penetrate the UBM material to reach the resist layer 103 due to the UBM material-free sidewall (or sidewalls) of the opening 110 when electron beam evaporation is used to deposit the UBM material, or due to the porous side walls of the opening 110 when sputtering or chemical vapor deposition is used to deposit the UBM material.

Figure 3:
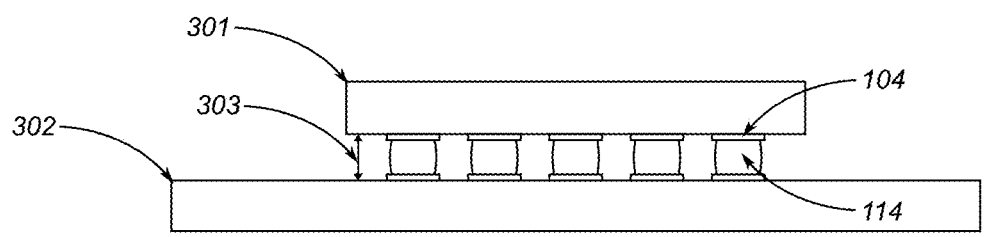
FIG. 3 shows a flip chip package produced by the example fabrication process, according to an embodiment of the present disclosure.

FIG. 3 shows a flip chip package produced by the fabrication process of the present invention. In a further step, which may take place after the method shown in FIG. 2, on which the flip chip bumps 114 have been formed, is connected to external circuitry 302, which may be a PCB or another patterned wafer or die, for example. The die 301 may be the result of a preceding wafer dicing step in which the patterned wafer 101 is diced to produce multiple die, such as die 301. The connection via the flip chip bumps 114 may be formed by reflowing the flip chip bumps using, for example, hot air reflow.

The chip-to-chip separation 303 in the flip chip package may be greater than 15 µm, or greater than 20 µm, which reduces crosstalk, allowing for improved component density on the patterned wafer die 301 and external circuitry 302. Furthermore, with a chip-to-chip separation above 15 µm, cavity modes do not have any significant effect on the properties of a qubit formed on one or both of the chips.

It will be appreciated that, although exemplary embodiments are shown in the drawings and described above, the principles of the invention may be implemented using any number of techniques, whether those techniques are currently known or not. The scope of protection is defined by the claims and should in no way be limited to the exemplary embodiments shown in the drawings and described above.

Although specific advantages have been described above, various embodiments may include some, none, or all of the describe advantages. Other advantages may be apparent to a person skilled in the art after reviewing the description and drawings.

Modifications, additions, or omissions may be made to the apparatuses, products and methods described above and shown in the drawings without necessarily departing from the scope of the claims. The components of the products and apparatuses may be integral to one another or be provided separately. The operations of the products and apparatuses and the methods described may include more, fewer, or other steps. Additionally, the steps of the methods or the operations of the products and apparatuses may be performed in any suitable order.

The invention claimed is:

1. A method comprising:
    forming a first resist over a patterned wafer, the first resist defining one or more first openings through which one or more areas of the patterned wafer are exposed;
    depositing an under bump metallization layer on the first resist and one or more exposed areas of the patterned wafer;
    forming a second resist over the deposited under bump metallization layer, the second resist defining one or more second openings, each of the one or more second openings exposing an area of the under bump metallization layer within one of the one or more first openings;
    depositing a flip chip bump within each of the one or more second openings in the second resist by electroplating; and
    removing the first resist, the second resist, and areas of the under bump metallization layer that lie between the first resist and the second resist, wherein the patterned wafer includes one or more quantum processing unit components.

2. The method of claim 1, wherein prior to forming the first resist over the patterned wafer, the method further comprises forming the patterned wafer by forming the one or more quantum processing unit components on the patterned wafer.

3. The method of claim 1, wherein the one or more quantum processing unit components include one or more Josephson junctions and/or other tunnelling barrier components.

4. The method of claim 1, wherein the one or more quantum processing unit components form one or more qubits.

5. The method of claim 4, wherein the one or more qubits are planar qubits.

6. The method of claim 1, wherein the under bump metallization layer is deposited by physical vapor deposition of an under bump metallization material.

7. The method of claim 6, wherein physical vapor deposition of the under bump metallization material is performed by electron beam evaporation and is performed at an angle offset from perpendicular to a surface of the first resist such that a portion of a sidewall or sidewalls of the first openings remain uncovered by the under bump metallization layer.

8. The method of claim 7, wherein deposition of the under bump metallization layer is performed such that the portions of the under bump metallization layer that are in direct contact with the exposed areas of the patterned wafer are electrically continuous with the portion of the under bump metallization layer that is deposited on the first resist.

9. The method of claim 8, wherein depositing the flip chip bumps by electroplating includes using the under bump metallization layer as a cathode such that a flip chip bump material is deposited on sections of the under bump metallization layer that are exposed by the one or more second openings in the second resist.

10. The method of claim 6, wherein physical vapor deposition is performed at an angle perpendicular to a surface of the first resist such that the under bump metallization material deposited on sidewalls of the first openings permits solvent to penetrate to the first resist.

11. The method of claim 1, wherein the under bump metallization layer is deposited by chemical vapor deposition of a under bump metallization material such that the under bump metallization material deposited on sidewalls of the first openings permits solvent to penetrate to the first resist.

12. The method of claim 1, wherein the flip chip bumps are indium flip chip bumps.

13. The method of claim 1, wherein the exposed areas of the patterned wafer are exposed electrical contacts.

14. The method of claim 1, further comprising forming a flip chip package by connecting the patterned wafer to external circuitry via the flip chip bumps.

* * * * *